United States Patent
Kwok

(10) Patent No.: US 12,362,766 B2
(45) Date of Patent: *Jul. 15, 2025

(54) METHODS AND SYSTEMS FOR ERROR-DETECTING DURING ITERATIVE DECODING

(71) Applicant: SK Hynix NAND Product Solutions Corp., Rancho Cordova, CA (US)

(72) Inventor: Zion Kwok, Burnaby (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/405,553

(22) Filed: Jan. 5, 2024

(65) Prior Publication Data

US 2024/0348265 A1 Oct. 17, 2024

Related U.S. Application Data

(63) Continuation of application No. 18/133,459, filed on Apr. 11, 2023.

(51) Int. Cl.
*H03M 13/09* (2006.01)
*H03M 13/00* (2006.01)

(52) U.S. Cl.
CPC ....... *H03M 13/095* (2013.01); *H03M 13/611* (2013.01)

(58) Field of Classification Search
CPC ................ H03M 13/095; H03M 13/611
See application file for complete search history.

(56) References Cited

U.S. PATENT DOCUMENTS

| | | | | |
|---|---|---|---|---|
| 8,751,889 | B2 * | 6/2014 | Zhang | H03M 13/1128 714/751 |
| 10,848,182 | B2 * | 11/2020 | Tate | H03M 13/1128 |
| 11,171,667 | B2 * | 11/2021 | Jang | H03M 13/114 |
| 2005/0172207 | A1 | 8/2005 | Radke et al. | |
| 2007/0157064 | A1 | 7/2007 | Falik et al. | |
| 2019/0012229 | A1 | 1/2019 | Cha et al. | |
| 2019/0138389 | A1 | 5/2019 | Kawanishi et al. | |
| 2020/0394102 | A1 | 12/2020 | Cha et al. | |
| 2024/0348265 | A1 * | 10/2024 | Kwok | H03M 13/095 |

* cited by examiner

*Primary Examiner* — Justin R Knapp
(74) *Attorney, Agent, or Firm* — Haley Guiliano LLP

(57) ABSTRACT

A system and related method, including memory and processing circuitry, which is to receive data and corresponding expected error-detecting code value. The processing circuitry processes the data in at least two portions by calculating and storing, in memory, an error-detecting code value for the respective portion. The processing circuitry is then to calculate an overall error-detecting code value based on the respective error-detecting code values for the at least two portions. When the overall error-detecting code value does not match the expected error-detecting code value the processing circuitry is to correct at least one portion and process the corrected portions by calculating an updated error-detecting code value for a respective one of the corrected portions and calculating an updated overall error-detecting code value based on the updated error-detecting code value for each corrected portions and the stored error-detecting code values.

21 Claims, 12 Drawing Sheets

METHODS AND SYSTEMS FOR ERROR-DETECTING DURING ITERATIVE DECODING

CROSS-REFERENCE TO RELATED APPLICATION

This application is a continuation of U.S. patent application Ser. No. 18/133,459, filed Apr. 11, 2023, the disclosure of which is incorporated by reference in its entirety.

BACKGROUND OF THE INVENTION

Not Applicable.

TECHNICAL FIELD

The present disclosure is directed to systems and methods for processing error-detecting code (e.g., cyclic redundancy check (CRC)) checksums by iterative updates or corrections on portions of data codewords.

SUMMARY

In accordance with the present disclosure, systems and methods are provided for processing error-detecting code checksums, such as cyclic redundancy checks (CRCs), by iterative updates on portions of data codewords in a system, such as in a storage device (e.g., a solid-state drive device). A cyclic redundancy check (CRC) is a linear error-detecting code which verifies values of data by expanding the data with additional data, without adding useful data information. The system and methods disclosed herein enable the use of memory and iterative updates or corrections of data portions in order to reduce the amount of latency and power consumption to process error-detecting code checksums.

In some embodiments, the system (e.g., a storage device) is provided with a memory and processing circuitry that are communicatively coupled to each other. In some embodiments the system can be distributed between a storage device and another device separate from the storage device (e.g., a host device, such as a storage controller device), such as where the host device provides processing circuitry to implement at least some of the functionality described herein. In some embodiments, the processing circuitry receives data and an expected error-detecting code value corresponding to the data. The processing circuitry is to process the data in at least two portions by calculating an error-detecting code value for each respective portion and storing the error-detecting code value for each respective portion into memory. The processing circuitry is further to calculate an overall error-detecting code value based on each error-detecting code value for each respective portion and to compare the overall error-detecting code value to the expected error-detecting code value. In some embodiments, when the overall error-detecting code value does not match the expected error-detecting code value, the processing circuitry corrects at least one of the portions of data to generate at least two corrected portions. The processing circuitry is further to process the at least two corrected portions of data by calculating an updated error-detecting code value for a respective portion of the corrected portions and calculating an updated overall error-detecting code value based on the updated error-detecting code value for the respective portion of the corrected portions and the stored error-detecting code values. In some embodiments, the updated overall error-detecting code value does not match the expected error-detecting code value, and therefore the processing circuitry is configured to correct at least one portion of the data and recalculate the updated overall error-detecting code value until the updated overall error-detecting code value matches the expected error-detecting code value.

BRIEF DESCRIPTION OF THE DRAWINGS

The following description includes discussion of figures having illustrations given by way of example of implementations of the disclosure. The drawings should be understood by way of example, and not by way of limitation. As used herein, references to one or more "embodiments" are to be understood as describing a particular feature, structure, and/or characteristic included in at least one implementation. Thus, phrases such as "in one embodiment" or "in an alternate embodiment" appearing herein describe various embodiments and implementations, and do not necessarily all refer to the same embodiment. However, they are also not necessarily mutually exclusive.

DETAILED DESCRIPTION

Figure 1:
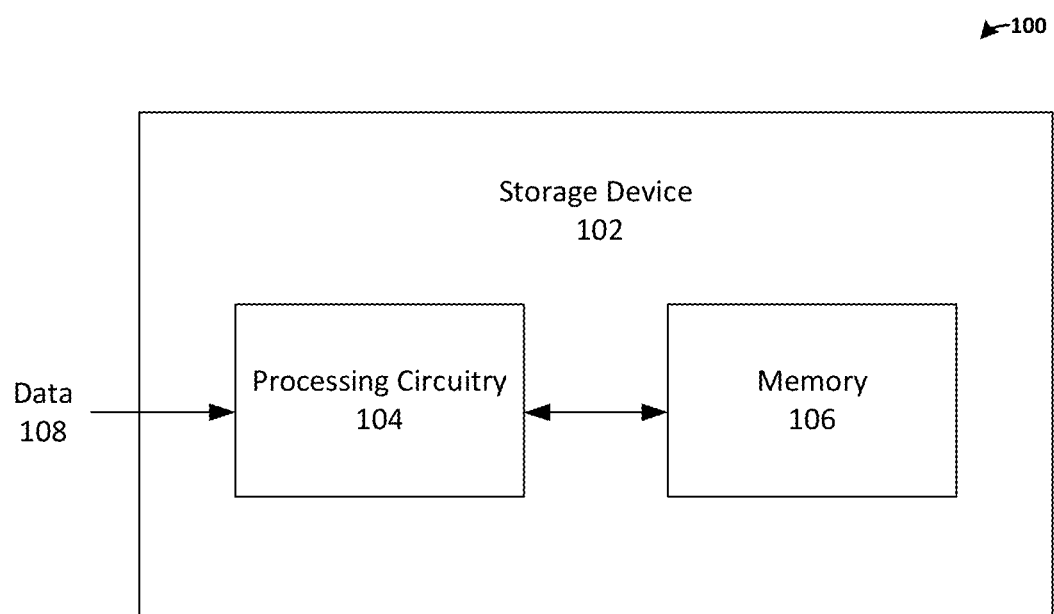
FIG. 1 shows an illustrative diagram of a system of a storage device with a processing circuitry and memory, in accordance with some embodiments of the present disclosure.

In accordance with the present disclosure, systems and method are provided for iterative error-detecting code value (e.g., checksum) processing on a storage device (e.g., a solid-state drive (SSD) device). In some embodiments, error-detecting code values are associated to corresponding data codewords, processed as whole data codewords. By processing the whole data codeword, the error-detecting code value associated with the data codeword is calculated from the beginning of the data codeword to the end of the data codeword. When an error is detected, the data codeword is corrected and the whole corrected data codeword is reprocessed. The processing of the error-detecting code value does not terminate until the last data bit of the corrected data codeword is processed, which may result in longer, redundant processing time and unnecessary power consumption.

When the error-detecting code value is a linear error-detecting code value (e.g., a CRC checksum), the process of correcting and calculating an updated overall error-detecting code value, such as CRC checksums, may be completed sequentially. However, in some instances of corrupted data, there may only be one error at the beginning of a data codeword, and the processing circuitry will unnecessarily continue to perform CRC checksum calculations on the other parts of the data codeword.

This process of correcting and calculating an updated overall error-detecting code value may also be done iteratively, where the data codeword is divided into at least two portions. The processing circuitry of a system may process each portion, saving the error-detecting code value of each respective portion in memory. Therefore, when a corrupted or erring portion of the data is corrected, the processing circuitry recalculates the error-detecting code value for the corrupted portion and then determines the updated overall error-detecting code value by using the error-detecting code values of each respective non-corrupted portion stored in memory.

Performing this process in an iterative manner enables the processing circuitry to terminate the process at the end of an iteration or at a middle portion of the data codeword. This results in an increased likelihood of reducing the number of iterations needed to perform error-detecting code checksums, which improves throughput of the processing circuitry and reduces latency and power consumption of the system. Additionally, by storing error-detecting code values of at least one portion of the data in memory, the methods and system disclosed herein reduces redundant and unnecessary processing executed by the processing circuitry.

For purposes of brevity and clarity, the features of the disclosure described herein are in the context of an SSD having processing circuitry and memory. However, the principles of the present disclosure may be applied to any other suitable context in which iterative error-detecting code checksum processing is used. A storage device may include processing circuitry and memory and the processing circuitry and memory are communicatively coupled by a network bus or interface. In some embodiments, the processing circuitry receives data, which may be driven on a network bus or interface from a source outside of the storage device or may be transmitted from within the storage device (i.e., from memory). In particular, the present disclosure provides systems and methods that leverage temporal locality of previous calculations stored in memory. Calculations that have recently processed error-detecting code values of portions are considered temporally local and may be quickly accessed in order to aid in outstanding operations of the storage device. In addition, iterative processing of portioned data reduces overall latency and power consumption and improves throughout when processing error-detecting code values by enabling the storage device to terminate the procedure after processing a few corrected data portions.

For example, an SSD device having processing circuitry receives data that is processed in at least two portions by the processing circuitry. The received data includes corresponding error-detecting code and an expected error-detecting code value, which is used by the processing circuitry to verify the integrity of the received data and ensure that the received data is valid. Invalid data may cause further errors, which may affect the performance or operation of the storage device. In some instances, data may have become corrupted during transmission or storage, and therefore error-detecting codes are used to ensure that the data is the same when received by the processing circuitry as when the data was originally stored in memory or transmitted from a source. In some circumstances of this example, a portion of the data and the corresponding portion of error-detecting code value has become corrupted during data transmission. In order to detect this error, the processing circuitry calculates and compares an overall error-detecting code value to the expected error-detecting code value. When the two values do not match, the processing circuitry determines that at least one portion of the data is corrupted and must be corrected.

In some embodiments, each portion of data corresponds to an error-detecting code state, which indicates whether a respective portion of data is corrupted. The error-detecting code state of each portion may be one of a correct error-detecting code state or an incorrect error-detecting code state. In some implementations, each error-detecting code state is a single bit, which reduces the amount memory required when compared to storing an error-detecting code value for each portion of data.

In some embodiments, a processor of the processing circuitry may be a highly parallelized processor capable of handling high bandwidths of incoming data quickly (e.g., by starting simultaneous processing of data portions before completion of previous data portions).

In some embodiments the system and methods of the present disclosure may refer to a storage device system (e.g., an SSD storage system), which includes a storage device such as a solid-state drive device, that is communicatively coupled to the processing circuitry by a network bus or interface.

An SSD is a data storage device that uses integrated circuit assemblies as memory to store data persistently. SSDs have no moving mechanical components, and this feature distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency.

Many types of SSDs use NAND-based flash memory which retain data without power and include a type of non-volatile storage technology. Quality of Service (QoS) of an SSD may be related to the predictability of low latency and consistency of high input/output operations per second (IOPS) while servicing read/write input/output (I/O) workloads. This means that the latency or the I/O command completion time needs to be within a specified range without having unexpected outliers. Throughput or I/O rate may also need to be tightly regulated without causing sudden drops in performance level.

The subject matter of this disclosure may be better understood by reference to FIGS. 1-12.

FIG. 1 shows an illustrative diagram of a system 100 of a storage device 102 with a processing circuitry 104 and memory 106, in accordance with some embodiments of the present disclosure. In some embodiments, storage device 102 may be a solid-state storage device (e.g., a solid-state drive device). In some embodiments, processing circuitry 104 may include a processor or any suitable processing unit. In some embodiments, memory 106 may be non-volatile memory. It will be understood that the embodiments of the present disclosure are not limited to SSDs. For example, in some embodiments, the storage device 102 may include a hard disk drive (HDD) device in addition to or in place of an SSD.

In some embodiments, the processing circuitry 104 is configured to receive data 108, which includes an expected error-detecting code value for data integrity verification. In some embodiments, data 108 is transmitted on a network bus or interface to the processing circuitry 104. In some embodiments, data 108 is transmitted from an external source (e.g., a host). In some embodiments, the processing circuitry 104 receives data (e.g., data 108) from both internal and external sources of the storage device 102. There may also be a temporary memory (e.g., a cache or queue) disposed within the processing circuitry 104, the temporary memory configured to store any outstanding data that is to be processed by the processing circuitry 104.

Additionally, storage device 102 includes memory 106. In some embodiments, memory 106 includes any one or more of a non-volatile memory, such as Phase Change Memory (PCM), a PCM and switch (PCMS), a Ferroelectric Random Access Memory (FeRAM), or a Ferroelectric Transistor Random Access Memory (FeTRAM), a Magnetoresistive Random Access Memory (MRAM), a memristor, a Spin-Transfer Torque Magnetoresistive Random Access Memory (STT-MRAM), and any other suitable non-volatile memory, or any combination thereof. In some embodiments, memory 106 includes any one or more of volatile memory, such as flip-flops, register memory, Static Random Access Memory (SRAM), Dynamic Random Access Memory (DRAM), and any other suitable volatile memory, or any combination thereof. In some embodiments, processing circuitry 104 is communicatively coupled to memory 106, in order to store and access data such as error-detecting code values for portions of the processed data. In some embodiments, a data bus interface is used to transport data 108 or an address associated with the data 108. The data bus between the memory 106 and processing circuitry 104 provides a network bus for the reading or writing of data (e.g., error-detecting code values) through memory 106. In some embodiments, the processor or processing unit of processing circuitry 104 may include a hardware processor, a software processor (e.g., a processor emulated using a virtual machine), or any combination thereof. The processor, also referred to herein as processing circuitry 104, may include any suitable software, hardware, or both for controlling the memory 106 and the processing circuitry 104. In some embodiments, the storage device 102 may further include a multi-core processor. Memory 106 may also include hardware elements for non-transitory storage of instructions, commands, or requests.

The processing circuitry 104 is configured to iteratively process through portions of data 108, where some portions of data may contain errors and are to be corrected. In addition, the processing circuitry 104 calculates and stores the error-detecting code value of each respective portion. Once the errors are corrected, the processing circuitry 104 may calculate an updated error correcting code value for the corrupted portions and reuse the stored error-detecting code values of each non-corrupted portion in order to determine the updated overall error-detecting code value. This process, completed by the processing circuitry 104, leverages temporal locality of previously calculated error-detecting code values of at least one portion of data in order to reduce the total latency and power consumption of the process of error-detecting code checksums.

In some embodiments, the expected error-detecting code value corresponding to the data 108 includes an expected linear error-detecting code corresponding to the data 108. In some embodiments, the expected linear error-detecting code corresponding to the data 108 includes a low-density parity-check (LDPC) code corresponding to the data 108.

Storage devices (for example, SSD devices) may include one or more packages of non-volatile memory dies, where each die includes storage cells. In some embodiments, the storage cells are organized into pages, and pages are organized into blocks. Each storage cell can store one or more bits of information.

It will be understood that, while system 100 depicts an embodiment in which a storage device 102 is configured to have iterative error-detecting code checksum processing capabilities in accordance with the present disclosure, any other suitable device can have iterative error-detecting code checksum processing capabilities in a similar manner.

For purposes of clarity and brevity, and not by way of limitation, the present disclosure is provided in the context of iterative error-detecting code checksum processing, that provides the features and functionalities disclosed herein. The process of iterative error-detecting code checksums may be configured by any suitable software, hardware, or both for implementing such features and functionalities. Iterative error-detecting code checksum processing may be at least partially implemented in, for example, storage device 102 (e.g., as part of processing circuitry 104, or any other suitable device on which efficiency may improve at high data structure depths). For example, for a solid-state storage device (i.e., storage device 100), iterative error-detecting code checksum processing may be implemented in processing circuitry 104.

Figure 2:
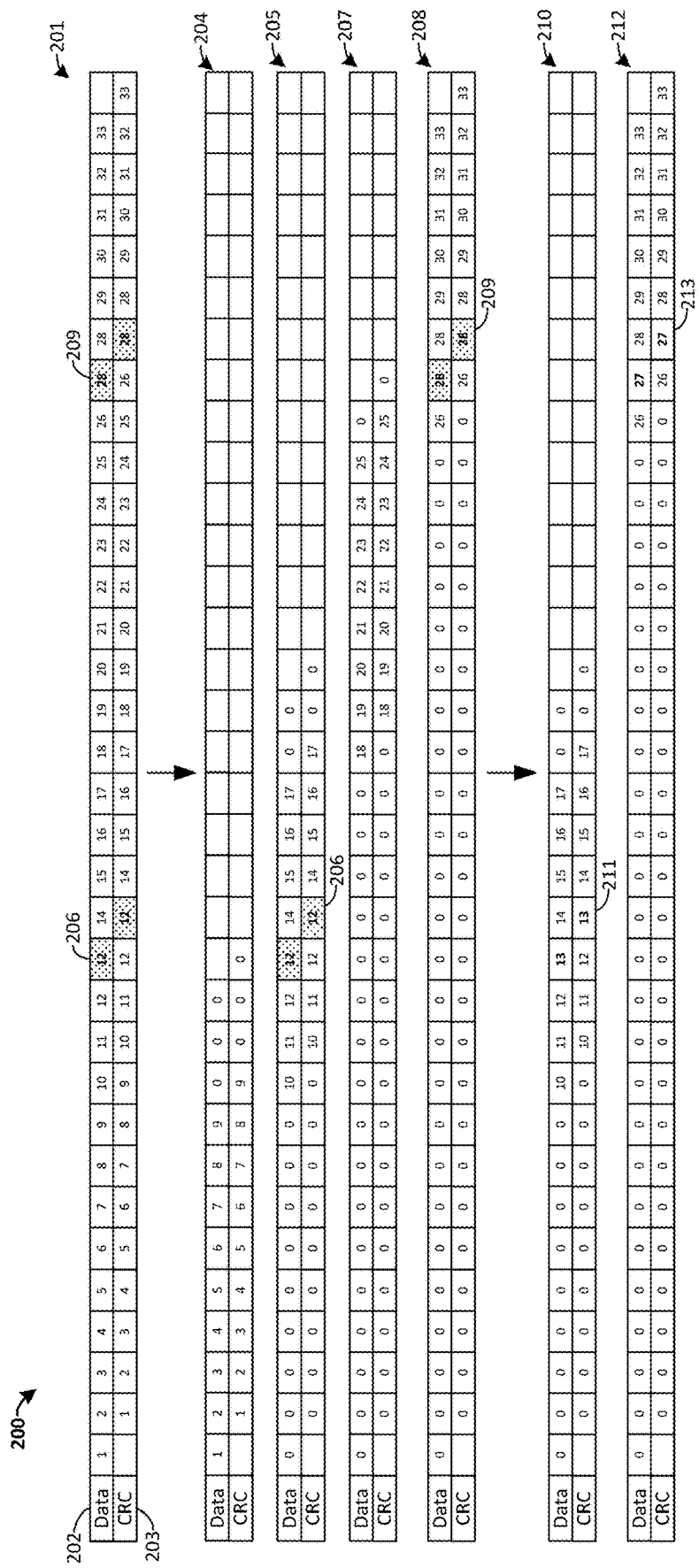
FIG. 2 shows an illustrative progression of a CRC checksum process of data divided into four portions, in accordance with some embodiments of the present disclosure.

FIG. 2 shows an illustrative progression of a CRC checksum process 200 of data divided into four portions (e.g., a first portion 204, a second portion 205, a third portion 207, and a fourth portion 208), in accordance with some embodiments of the present disclosure. Although the progression shown in FIG. 2 is for a CRC checksum process 200, the progression shown may be used for any form of an error-detecting code (e.g., a linear error-detecting code). In addition, each stage of the progression includes the data codeword 202 or portion of the data codeword, as well as the corresponding CRC values 203.

At first, a whole data codeword 201 (e.g., data 108) is received by the processing circuitry 104. In this this implementation, the data codeword 201 received is 33 bytes long. In some embodiments, each byte (i.e., byte 1 to byte 33) of the data codeword may contain a value in the range of 0 to 255. However, the disclosure is not limited to data codewords that are 33 bytes in length. Data codeword includes two corrupted bytes of data, a first corrupted byte of data 206 and a second corrupted byte of data 209. In addition, although not shown, a corresponding expected CRC checksum value is received with the data codeword 201 and will be used to verify the validity of the data codeword 201.

The process 200, by way of processing circuitry 104, divides the whole data codeword 201 into four portions of data, including a first portion of data 204, a second portion of data 205, a third portion of data 207, and a fourth portion of data 208. As presently portioned, the first corrupted byte 206 is located within the second portion of data 205 and the second corrupted byte 209 is located within the fourth portion of data 208. In some embodiments, each portion of data corresponds to an error-detecting code state, which indicates whether a respective portion of data is corrupted. The error-detecting code state of each portion may be one of a correct error-detecting code state or an incorrect error-detecting code state. The process 200, by way of the processing circuitry 104, processes each portion of the data (e.g., 204, 205, 207, 208) in an iterative manner, and determines a CRC checksum value for each respective portion. The processing circuitry 104 stores the CRC checksum value for each respective portion into memory 106. The processing circuitry 104 then determines an overall CRC checksum value as a sum of the CRC checksum value of each respective portion of data (e.g., 204, 205, 207, 208). The processing circuitry 104 compares the overall CRC checksum value to the expected CRC checksum value. The processing circuitry 104 may determine that the overall CRC checksum value does not match the expected CRC checksum value due to at least one of the portions of data with a corrupted byte of data (e.g., the second portion 205 and the fourth portion 208).

As a part of process 200, the processing circuitry 104 then corrects the first corrupted byte of data 206 and the second corrupted byte of data 209. In some embodiments, the processing circuitry 104 requests for at least one portion of data to be retransmitted in order to correct the at least one portion of data. Once the corrupted portions of data (e.g., second portion of data 205 and fourth portion of data 208) are corrected, the processing circuitry 104 receives a corrected second portion of data 210 and a corrected fourth portion of data 212. The corrected second portion of data 210 contains a corrected byte of data 211 at the same byte address of the corrupted first byte of data 206 in the second portion of data 205. Additionally, the corrected fourth portion of data 212 contains a corrected byte of data 213 at the same byte address of the corrupted second byte of data 209 in the fourth portion of data 208. In some embodiments, once a respective portion of data is corrected, the error-detecting code state corresponding to the respective portion of data is set to a correct error-detecting code state.

Once the corrupted portions are corrected, the processing circuitry 104 determines an updated CRC checksum value for each corrected portion (e.g., corrected second portion of data 210 and corrected fourth portion of data 212). An updated overall CRC checksum value is determined, by the processing circuitry 104, based on each updated CRC checksum value of the corrected portions of data 210, 212 and the stored CRC checksum value of each of the first portion of data 204 and the third portion of data 207. When the processing circuitry 104 determines that the updated overall CRC checksum value matches the expected CRC checksum value, the process 200 is complete for data codeword 201.

Figure 3:
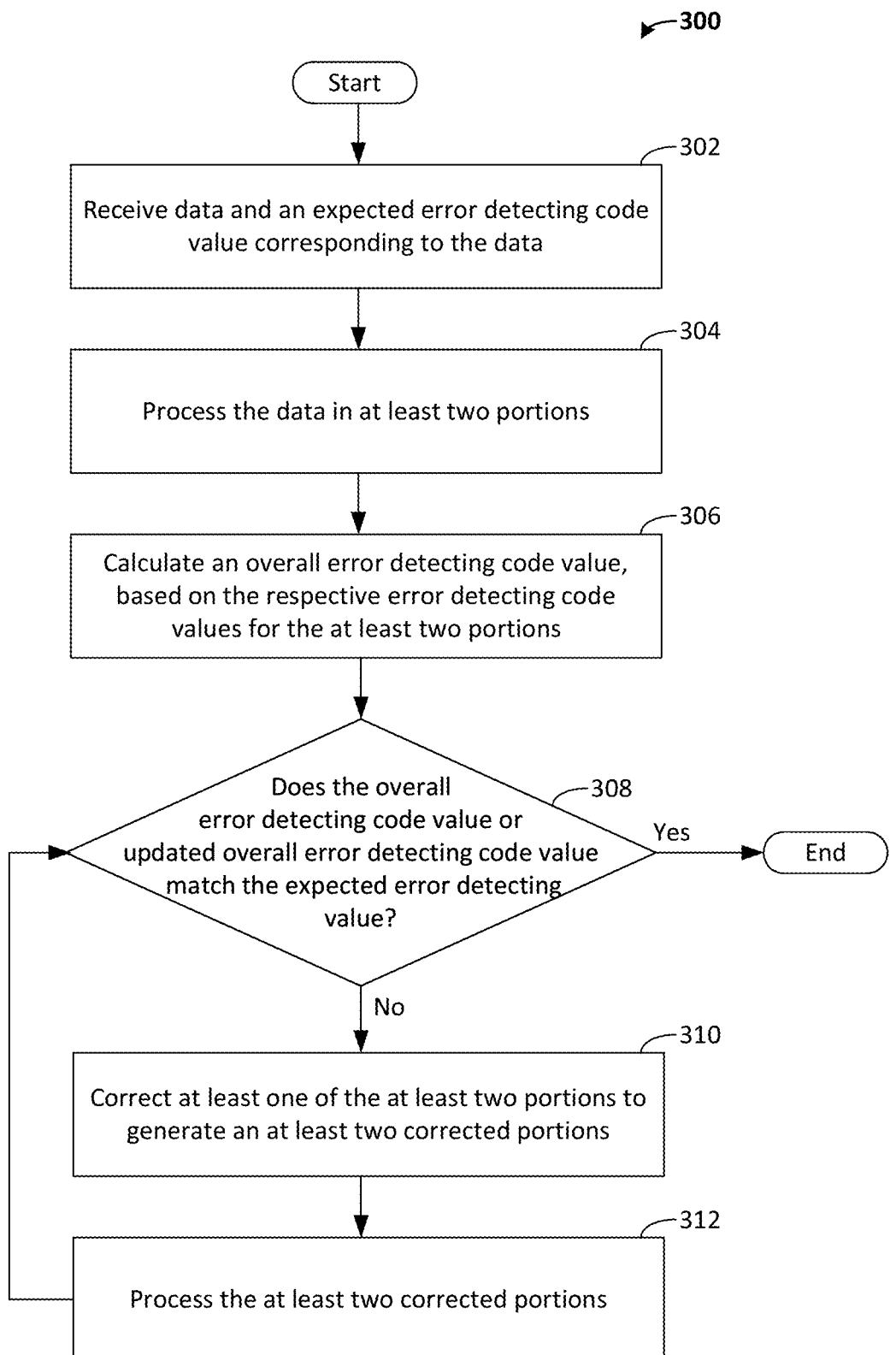
FIG. 3 shows a flowchart of illustrative steps for processing CRCs checksums by iterative updates on portions of data codewords, in accordance with some embodiments of the present disclosure.

FIG. 3 shows a flowchart 300 of illustrative steps for processing CRCs checksums by partial iterative updates on portions of data codewords, in accordance with some embodiments of the present disclosure. In some embodiments, the referenced storage device, processing circuitry, and memory may be implemented as storage device 102, processing circuitry 104, and memory 106, respectively. In some embodiments, the process 300 can be modified by, for example, having steps rearranged, changed, added, and/or removed.

At step 302, the processing circuitry 104 receives data (e.g., data 108) and an expected error-detecting code value corresponding to the data. In some embodiments, the data is received, by the processing circuitry 104, by a network bus or interface. The expected error-detecting code value is used by the processing circuitry 104 when verifying the integrity of the data. The processing circuitry 104 is capable to check that the received data is of the same state as when it was transmitted or stored into memory. The data (e.g., data 108) includes the expected error-detecting code value. For example, the expected error-detecting code value may be wrapped in a header field of the received data. In some embodiments, the storage device 102 receives more than one data. At least one of the received data may be stored in memory, such as a cache or queue, or any form of volatile memory. In some embodiments, the processing circuitry 104 may include a multi-core processor which can perform iterative error-detecting code checksums on more than one codeword.

At step 304, the processing circuitry 104 processes the data in at least two portions. In some embodiments wherein the data is 33 bytes long, the processing circuitry 104 may process the data in up to 264 portions, such that the minimum size of a portion is a single bit. In some embodiments, the maximum number of portions of a data may be defined as the codeword size, or total number of bits of the data, divided by the minimum size of a portion (e.g., a single bit). To process each portion the processing circuitry 104 is configured to calculate an error-detecting code value for a respective portion, and store, in memory 106, the calculated error-detecting code value for the respective portion. As seen in the process 200 of FIG. 2, the data may be processed in four portions, however, may be subdivided further into smaller portions. The added granularity by subdividing into smaller portions increases the number of partial iterations required to process the whole data codeword (e.g., data 108). However, a smaller data portion incurs less latency than a larger portion, and therefore the processor may operate at a greater frequency. In some embodiments, each portion of the data is of a similarly equivalent length, which may be measured by a number of bytes or bits. In some embodiments, when processing the at least two portions including a first portion of a first length and a second portion of a second length, the processing circuitry 104 may determine that the second length is greater than the first length. The processing circuitry 104 then pads the first portion with zeros so that the first portion is of a similarly equivalent length as the second portion. Once each portion is processed, the processing circuitry 104 has processed the whole data codeword and can calculate an overall error-detecting code value, at step 306.

At step 306, processing circuitry 104 calculates the overall error-detecting code value, based on the respective error-detecting code values of the at least two portions of the data (e.g., data 108). In some embodiments, the error-detecting code transmitted with data (e.g., data 108) is a linear error-detecting code, such as CRC code, which enables the error-detecting code values for each respective portion of the data to be added together to calculate the overall detecting code value. In some embodiments, the overall error-detecting code value is stored in memory 106. The overall error-detecting code value is used by the processing circuitry 104 when verifying the integrity of the data by comparing the overall error-detecting code with the expected error-detecting code value, which is shown at step 308.

At step 308, the processing circuitry determines whether the overall error-detecting code value matches the expected error-detecting code value that was included with the transmitted data (e.g., data 108). When the overall error-detecting code value matches the expected error-detecting code value, the processing circuitry 104 may reliably verify that the data has not been corrupted while transmitting over a network bus or interface before received by the processing circuitry 104. In such an instance, the error-detecting code checksum process is complete for that data codeword. In contrast, when the overall error-detecting code value does not match the expected error-detecting code value, the processing circuitry 104 determines that there is at least one corrupted or erring portion of the data. Therefore, the processing circuitry 104 is then to correct at least one of the portions of data, at step 310, in order to have a valid data codeword for further processing.

At step 310, the processing circuitry is configured to correct at least one of the at least two portions of data (e.g., data 108) to generate at least two corrected portions. In some embodiments, the processing circuitry 104 is configured to request a portion of the data to be retransmitted. This enables the processing circuitry 104 to request a portion of data to replace the corrupted portion with a corrected portion of the data. In some embodiments, the processing circuitry 104 is configured to request the whole data codeword to be retransmitted. In addition, this disclosure is not limited to data correction by way of data retransmission. In some embodiments, an LDPC decoder may be used to determine that a particular data bit or subset of data is incorrect and therefore the particular data bit or subset of data is to be flipped. The processing circuitry 104 corrects at least one portion of data, and then processes the corrected portions of data, at step 312.

At step 312, the processing circuitry 104 processes the at least two corrected portions. The processing circuitry 104 calculates an updated error-detecting code value for each respective one of the at least two corrected portions. In some embodiments, the processing circuitry 104 is configured to then calculate an updated overall error-detecting code value based on each of the updated error-detecting code values for the respective portion of the at least two corrected portions and each stored error-detecting code values in memory 106. The processing circuitry 104 is then to determine whether the updated overall error-detecting code value matches the expected error-detecting code value, at step 308. If the updated overall error-detecting code value does match the expected overall error-detecting code value, the data (e.g., data 108) has been corrected and verified as valid data. However, in some embodiments, there may remain at least one corrupted portion of data that causes the updated overall error-detecting code value to not match the expected overall error-detecting code value. In some embodiments, retransmitted data, seen at step 310, may have been corrupted when being retransmitted. The process will continue to sequentially step through steps 308, 310, and 312 until the updated overall error-detecting code value matches the expected overall error-detecting code value.

Figure 4:
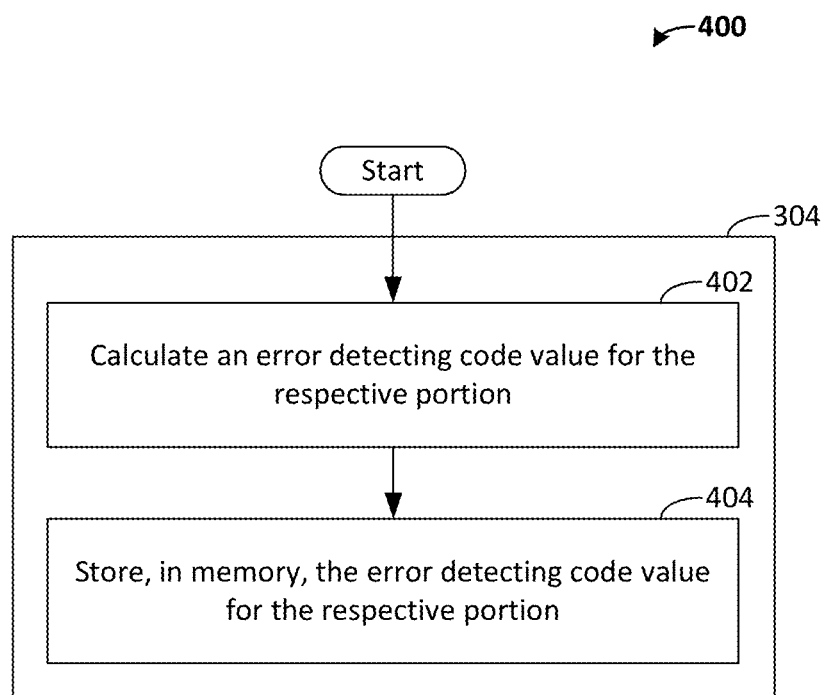
FIG. 4 shows a flowchart of illustrative steps for processing the data in at least two portions of data shown in FIG. 3 by calculating and storing an error-detecting code value for each portion of data, in accordance with some embodiments of the present disclosure.

FIG. 4 shows a flowchart for process 400, including illustrative steps for processing the data in at least two portions of data shown in FIG. 3 by calculating and storing an error-detecting code value for each portion of data, in accordance with some embodiments of the present disclosure. Process 400 can also be referred to as step 304, as seen in FIG. 3. In some embodiments, the referenced storage device, processing circuitry, and memory may be implemented as storage device 102, processing circuitry 104, and memory 106, respectively. In some embodiments, the process 400 can be modified by, for example, having steps rearranged, changed, added, and/or removed.

At step 402, the processing circuitry 104 is configured to calculate an error-detecting code value for the respective portion. In some embodiments, the processing circuitry 104 may calculate the error-detecting code value for a respective portion of data by using hash functions (i.e., with polynomial division), fingerprints, matrix multiplication, linear feedback shift registers, or randomization functions. Once the processing circuitry 104 calculates an error-detecting code value for a respective portion of data, the processing circuitry 104 stores, in memory 106, the calculated error-detecting code value for the respective portion, at step 404.

At step 404, processing circuitry 104 stores the error-detecting code value for each respective portion into memory 106. Storing the error-detecting code values for each portion of the data 108 into memory enables the processing circuitry 104 to leverage previously calculated error-detecting code values when a portion of data 108 is determined to be corrupted and is to be corrected. The total latency and power consumption of the process of error-detecting code checksums can be reduced by accessing previously calculated error-detecting code values of at least one portion of data.

Figure 5:
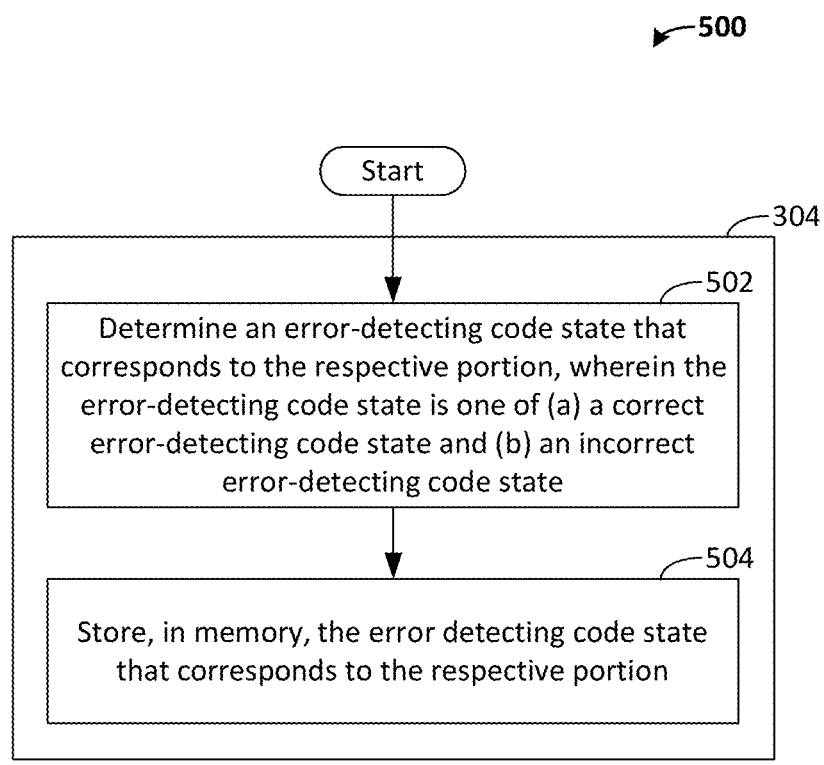
FIG. 5 shows a flowchart of illustrative steps for processing the data in at least two portions of data shown in FIG. 3 by determining and storing an error-detecting code state that corresponds to the respective portion of data, in accordance with some embodiments of the present disclosure.

FIG. 5 shows a flowchart for process 500, including illustrative steps for processing the data in at least two portions of data shown in FIG. 3 by determining and storing an error-detecting code state that corresponds to the respective portion of data, in accordance with some embodiments of the present disclosure. Process 500 can also be referred to as step 304, as seen in FIG. 3. In some embodiments, the referenced storage device, processing circuitry, and memory may be implemented as storage device 102, processing circuitry 104, and memory 106, respectively. In some embodiments, process 500 can be modified by, for example, having steps rearranged, changed, added, and/or removed.

At step 502, the processing circuitry 104 is configured to determine an error-detecting code state that corresponds to the respective portion. The error-detecting code state may be one of a correct error-detecting code state and an incorrect error-detecting code state. In some cases, an incorrect error-detecting code state is determined to correspond to a portion of data when the portion of data is corrupted and is to be corrected. When the error-detecting code state of a respective portion of data is an incorrect error-detecting code state, the respective portion of data is corrected before traversing the data codeword to other portions of data that correspond to an incorrect error-detecting code state. In some embodiments, the error-detecting code state may be implemented as a bit flip, which uses a single bit to indicate the error-detecting code state for a respective portion of data. In some embodiments, an LDPC decoder may determine that a particular data bit is incorrect and should be flipped. Once the processing circuitry 104 determines the error-detecting code state that corresponds to the respective portion of data, the processing circuitry 104 stores, in memory 106, the error-detecting code state that corresponds to the respective portion, at step 504.

At step 504, processing circuitry 104 stores the error-detecting code state that corresponds to the respective portion into memory 106. Storing the error-detecting code state for a portion of the data 108 into memory enables the processing circuitry 104 to determine each portion of data of the data codeword that corresponds to an incorrect error-detecting code state and correct each of these determined portions of data faster than calculating the overall error-detecting code value based on the corrected portions of data and any error-detecting code values stored in memory 106. By using single bit error-detecting code states for each portion of data, the amount of memory 106 required is reduced when compared to storing error-detecting code values.

Figure 6:
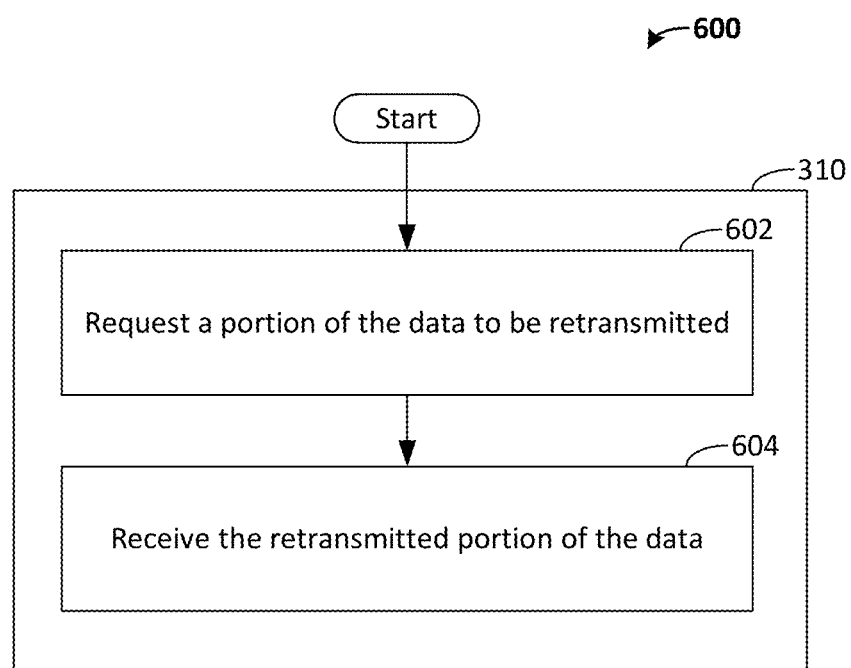
FIG. 6 shows a flowchart of illustrative steps for correcting at least one of the at least two portions of data to generate at least two corrected portions shown in FIG. 3, in accordance with some embodiments of the present disclosure.

FIG. 6 shows a flowchart for process 600, including illustrative steps for correcting at least one of the at least two portions of data to generate at least two corrected portions shown in FIG. 3, in accordance with some embodiments of the present disclosure. Process 600 can also be referred to as step 310, as seen in FIG. 3. In some embodiments, the referenced storage device, processing circuitry, and memory may be implemented as storage device 102, processing circuitry 104, and memory 106, respectively. In some embodiments, the process 600 can be modified by, for example, having steps rearranged, changed, added, and/or removed.

At step 602, processing circuitry 104 requests a portion of the data 108 to be retransmitted. In some embodiments, the processing circuitry 104 receives data 108 from both internal and external sources of the storage device 102. The processing circuitry 104 is configured to send a request to the source of the data 108 for a portion of the data 108 to be retransmitted. In some embodiments, the processing circuitry is configured to send a request for the whole data codeword to be retransmitted. After the processing circuitry 104 sends a request for at least a portion to be retransmitted from the source of the data, the processing circuitry 104 receives the requested data, at step 604.

At step 604, processing circuitry 104 is configured to receive the retransmitted portion of the data 108. In some embodiments, the retransmitted portion of data is received by the processing circuitry 104 from a network bus or interface. In some embodiments, the processing circuitry receives a whole data codeword that has been requested to retransmit. In some embodiments, the received retransmitted portion of the data is stored in memory, such as a cache or queue, or any form of volatile memory prior to further processing.

Figure 7:
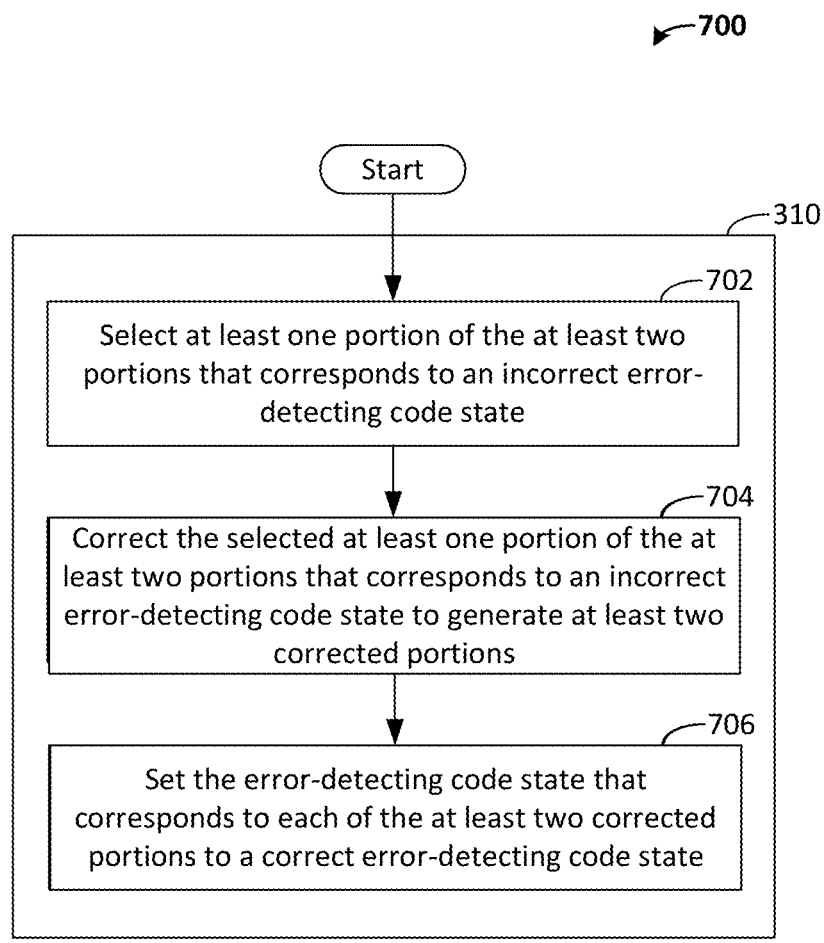
FIG. 7 shows a flowchart of illustrative steps for correcting at least one of the at least two portions of data shown in FIG. 3 to set the error-detecting code state that corresponds to each of the at least two corrected portions to a correct error-detecting code state, in accordance with some embodiments of the present disclosure.

FIG. 7 shows a flowchart for process 700, including illustrative steps for correcting at least one of the at least two portions of data shown in FIG. 3 to set the error-detecting code state that corresponds to each of the at least two corrected portions to a correct error-detecting code state, in accordance with some embodiments of the present disclosure. Process 700 can also be referred to as step 310, as seen in FIG. 3. In some embodiments, the referenced storage device, processing circuitry, and memory may be implemented as storage device 102, processing circuitry 104, and memory 106, respectively. In some embodiments, the process 700 can be modified by, for example, having steps rearranged, changed, added, and/or removed.

At step 702, processing circuitry 104 selects at least one portion of the at least two portions that corresponds to an incorrect error-detecting code state. In some embodiments, the processing circuitry 106 uses matrixes in order to traverse through the data codeword, either by forward traversal or backwards/rewound traversal. In some implementations, an updating matrix may be used to traverse to a portion of data that corresponds to an incorrect error-detecting code state and is to be corrected. In some embodiments, the updating matrix may be used to step through each of the portions of data, or the updating matrix may be updated by matrix multiplication to traverse to a particular portion of data. After the processing circuitry 104 selects at least one portion of the at least two portions that corresponds to an incorrect error-detecting code state, the processing circuitry 104 corrects the selected at least one portion that corresponds to an incorrect error-detecting code state to generate at least two corrected portions, at step 704.

At step 704, processing circuitry 104 is configured to correct the selected at least one portion that corresponds to an incorrect error-detecting code state to generate at least two corrected portions. In some embodiments, the processing circuitry 104 may correct a portion of data that corresponds to an incorrect error-detecting code state by the same process as shown in process 700. After the processing circuitry 104 corrects the selected at least one portion that corresponds to an incorrect error-detecting code state to generate at least two corrected portions, the processing circuitry 104 sets the error-detecting code state that corresponds to each of the at least two corrected portions to a correct error-detecting code state, at step 706.

At step 706, processing circuitry 104 is configured to set the error-detecting code state that corresponds to each of the at least two corrected portions to a correct error-detecting code state. In some embodiments, processing circuitry 104 continues to traverse the data codeword, correct further portions of data that correspond to an incorrect error-detecting code state until there are no portions of the data codeword that correspond to an incorrect error-detecting code state. In some implementations, there may be a whole codeword error-detecting code state, which indicates whether any one portion of data within the data codeword corresponds to an incorrect error-detecting code state.

Figure 8:
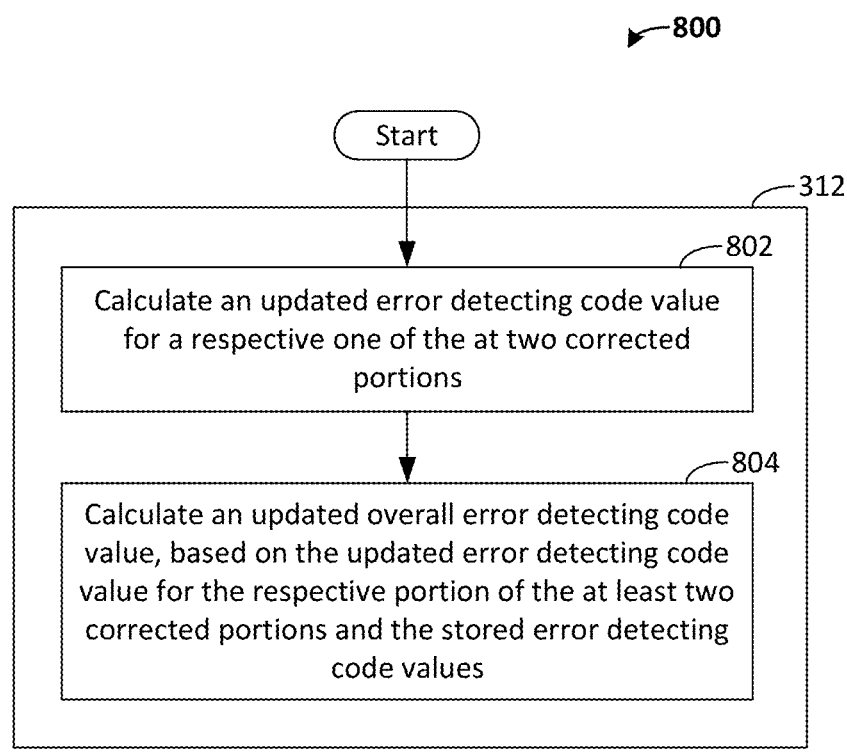
FIG. 8 shows a flowchart of illustrative steps for processing the at least two corrected portions of data shown in FIG. 3, in accordance with some embodiments of the present disclosure.

FIG. 8 shows a flowchart for process 800, including illustrative steps for processing the at least two corrected portions of data shown in FIG. 3, in accordance with some embodiments of the present disclosure. Process 800 can also be referred to as step 312, as seen in FIG. 3. In some embodiments, the referenced storage device, processing circuitry, and memory may be implemented as storage device 102, processing circuitry 104, and memory 106, respectively. In some embodiments, the process 800 can be modified by, for example, having steps rearranged, changed, added, and/or removed.

At step 802, the processing circuitry 104 calculates an updated error-detecting code value for a respective portion of the two corrected portions of data 108. In some embodiments, the processing circuitry 104 is to calculate the updated error-detecting code value of a respective corrected portion of data 108 in a similar manner to how the error-detecting code value is calculated (as seen in step 402 of FIG. 4). In some embodiments, the processing circuitry 104 overwrites the error-detecting code value of a corrected portion of data 108 at an address in memory 106 with the updated error-detecting code value of the corrected portion of data. The processing circuitry 104 is then configured to calculate an updated overall error-detecting code value based on at least each of the updated error-detecting code values, at step 804.

At step 804, processing circuitry 104 is configured to calculate an updated overall error-detecting code value, based on the updated error-detecting code value for the respective portion of the at least two corrected portions and the stored error-detecting code values in memory 106. In some embodiments, the error-detecting code value is a linear error-detecting code value, such as a CRC checksum. In some implementations using linear error-detecting code values, the processing circuitry 104 calculates the updated overall error-detecting code value by calculating the sum of the updated error-detecting code value of the at least one corrected portion and the stored error-detecting code value of each non-corrupted portion. In other implementations using linear error-detecting code values, the processing circuitry 104 calculates the updated overall error-detecting code value by calculating the sum of the stored overall error-detecting code value before the most recent portion correction, and each difference in the updated error-detecting code value and the stored error-detecting code value of a respective corrupted portion of data.

Figure 9:
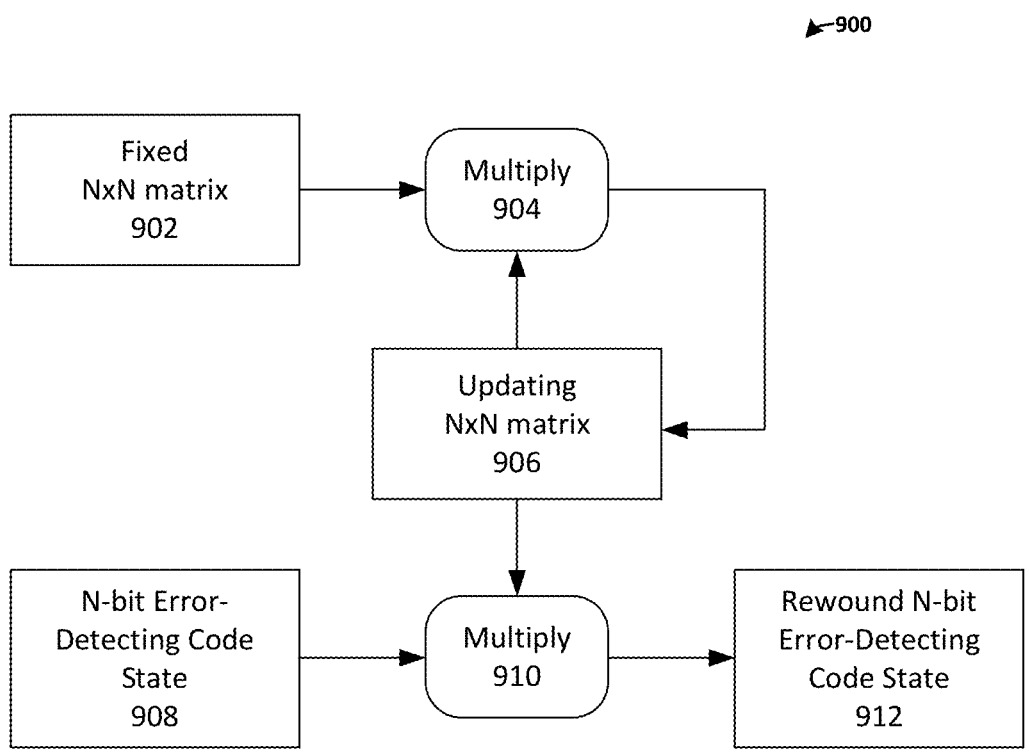
FIG. 9-11 show flowcharts of illustrative steps for determining a rewound error-detecting code state of data codewords, in accordance with some embodiments of the present disclosure.
Figure 10:
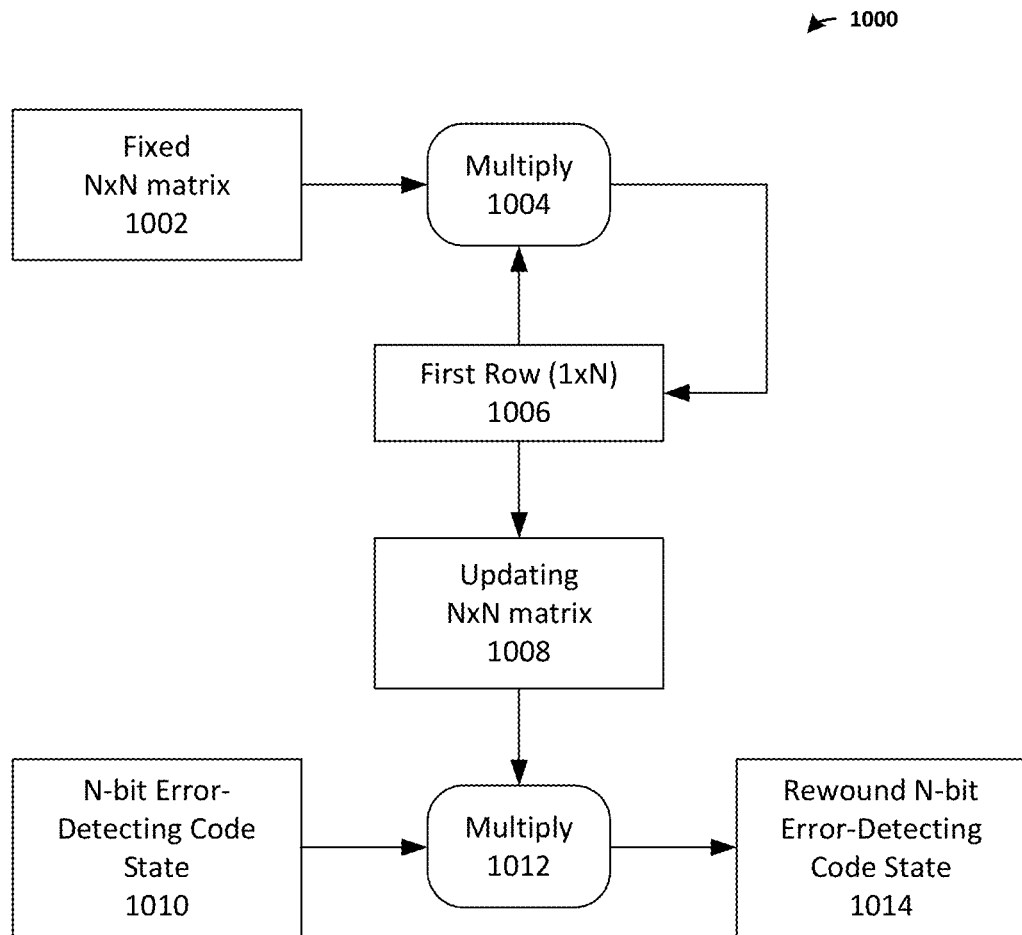
Figure 11:
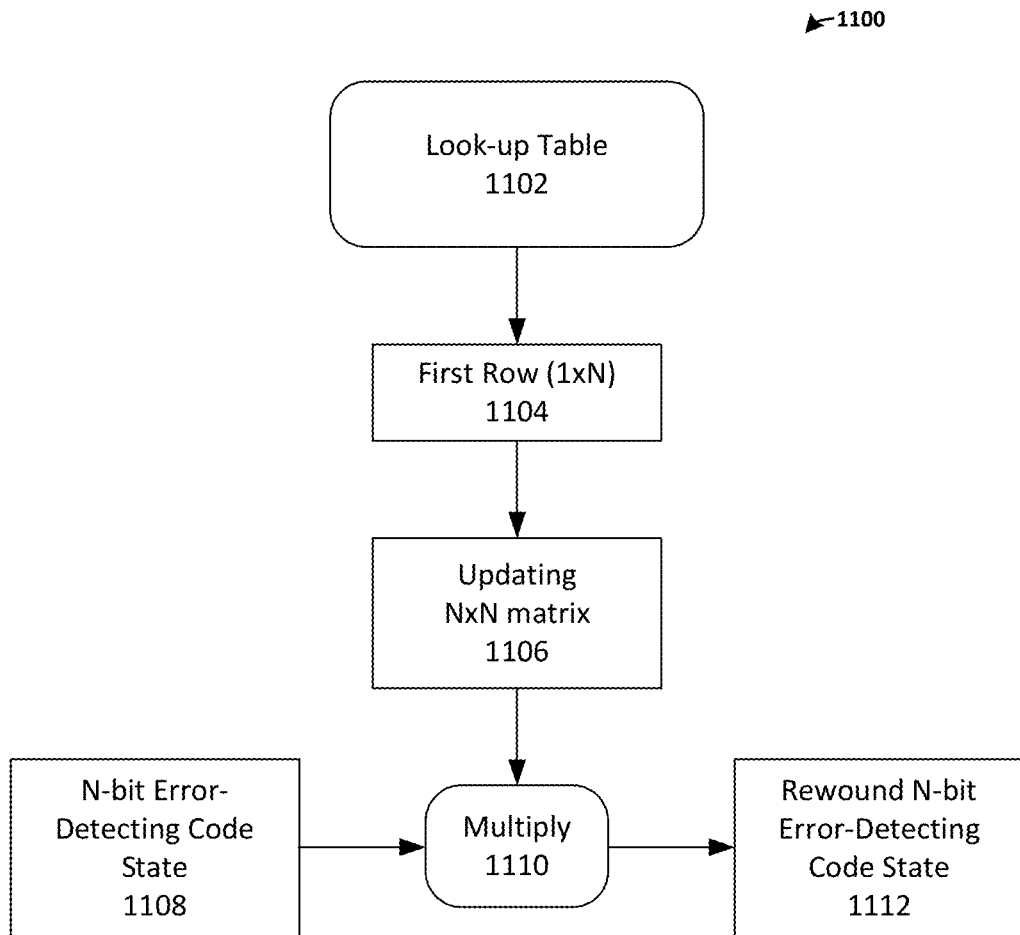

FIG. 9-11 show flowcharts for processes (e.g., 900, 1000, and 1100) including illustrative steps for determining a rewound error-detecting code state (e.g., 912, 1014, and 1112) of data codewords, in accordance with some embodiments of the present disclosure. Implementing the use of error-detecting code states for each portion of the data enables the processing circuitry 104 to determine each portion of data that corresponds to an incorrect error-detecting code state, correct each of these determined portions of data, and calculate the overall error-detecting code value based on the corrected portions of data and any error-detecting code values stored in memory 106. The total memory required can be reduced by storing single bit error-detecting code states for access rather than error-detecting code values for each portion of data.

The flowchart for process 900 includes a fixed N-bit by N-bit matrix 902, which may be used to determine an updating N-bit by N-bit matrix 906. In some implementations, N is the number of bits in the error-detecting code state (e.g., 908 and 912). The fixed N×N matrix 902 may be stored in memory 106 and is used to traverse one step in reverse, where a step refers to a fixed distance between two bit positions in a data codeword. In some implementations, to step over multiple portions of data, the fixed N×N matrix 902 may be multiplied 904 to generate an updating N×N matrix 906. In some implementations, the updating N×N matrix 906 may be multiplied 904 to further update the updating N×N matrix 906. Process 900 shows that to generate a rewound N-bit error-detecting code state 912 by multiplying 910 the updating N×N matrix 906 and the N-bit error-detecting code state 908.

The flowchart for process 1000 shows a simplified logic to generate the rewound N-bit error-detecting code state 1014 with less logical gates needed. Process 1000 shows a first row 1006 of an updating N×N matrix 1008, where the first row 1006 is used to determine any subsequent row of the updating N×N matrix 1008. The first row 1006 is multiplied 1004 with a fixed N×N matrix 1002 to generate the second row, which is used for the updating N×N matrix 1008 and for generating the third row. Process 1000 then shows that to generate a rewound N-bit error-detecting code state 1014 by multiplying 1010 the updating N×N matrix 1008 and the N-bit error-detecting code state 1010.

The flowchart for process 1100 shows an out-of-order rewinder logic, including a look-up table 1102, which may be used to determine a respective row (i.e., a first row 1104) for the updating N×N matrix 1106. In some embodiments, the logic may include a multiplier in order to reduce the number of rows stored in the look-up table 1102. For example, a multiplier enables that every odd row is stored in the look-up table 1102, and any subsequent row may be determined by matrix multiplication of a fixed N×N matrix. Process 1100 then shows that to generate a rewound N-bit error-detecting code state 1112 by multiplying 1110 the updating N×N matrix 1008 and the N-bit error-detecting code state 1108.

Figure 12:
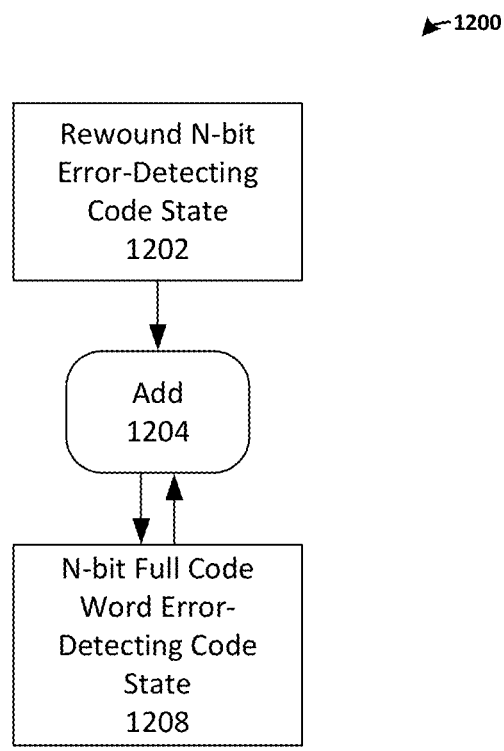
FIG. 12 shows a flowchart of illustrative steps for updating an N-bit full codeword error-detecting code state, in accordance with some embodiments of the present disclosure.

FIG. 12 shows a flowchart for process 1200 including illustrative steps for updating an N-bit full codeword error-detecting code state 1208, in accordance with some embodiments of the present disclosure. The process 1200 shows to update the N-bit full codeword error-detecting code state by adding 1204 a rewound N-bit error detecting code state 1202 (such as 912, 1014, and 1112) to a previous N-bit full codeword error-detecting code state. After the N-bit full codeword error-detecting code state 1208 is updated with the rewound N-bit error-detecting code state 1202, the processing circuitry 104 may determine whether there are any further portions of data that correspond to an incorrect error-detecting code state. If any bit of the N-bit full codeword error-detecting code state 1208 indicates an incorrect error-detecting code state, the processing circuitry 104 is to proceed with further data portion correction.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments. Further, although process steps, method steps, algorithms or the like may be described in a sequential order, such processes, methods, and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified, or removed. Moreover, steps may be added to the above-described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

What is claimed is:

1. A method for correcting data, the method comprising:
receiving, by processing circuitry of a storage device, a plurality of portions of the data and an expected error-detecting code value corresponding to the data;
calculating, by the processing circuitry, an overall error-detecting code value of the data;
comparing, by the processing circuitry, the overall error-detecting code value to the expected error-detecting code value; and
in response to determining that the overall error-detecting code value does not match the expected error-detecting code value based on the comparing:
identifying, by the processing circuitry, at least one portion of the plurality of portions of the data as corresponding to an incorrect error-detecting code state;
for each respective portion of the identified at least one portion:
stepping, by the processing circuitry, to the respective portion of the identified at least one portion; and
correcting, by the processing circuitry, the respective identified portion of the identified at least one portion of the data that corresponds to the incorrect error-detecting code state to generate a corrected plurality of portions of data; and
setting, by the processing circuitry, the incorrect error-detecting code state that corresponds to each of the identified at least one portion of the data to a correct error-detecting code state.

2. The method according to claim 1, wherein stepping to the respective portion of the identified at least one portion comprises stepping, in reverse, to the respective portion of the identified at least one portion.

3. The method according to claim 1, wherein identifying at least one portion of the plurality of portions of the data as corresponding to an incorrect error-detecting code state comprises identifying at least one portion of the plurality of portions by traversing the plurality of portions of the data.

4. The method according to claim 1, wherein the identifying at least one portion of the plurality of portions of the data as corresponding to the incorrect error-detecting state comprises traversing the plurality of portions of the data in reverse by using an updating matrix.

5. The method according to claim 4, wherein the data corresponds to an N-bit error-detecting code state and the updating matrix is a square matrix of size N, wherein the traversing the plurality of portions of the data in reverse comprises determining a rewound error-detecting code state by performing matrix multiplication of the N-bit error-detecting code state and the updating matrix.

6. The method according to claim 1, wherein the calculating the overall error-detecting code value of the data comprises:
calculating an error-detecting code value for each respective portion of the plurality of portions of the data;
storing, in memory of the storage device, the error-detecting code value for each respective portion of the plurality of portions of the data; and
calculating the overall error-detecting code value based on each respective error-detecting code values for each respective portion of the data.

7. The method according to claim 1, further comprising:
(a) calculating an updated overall error-detecting code value of the corrected plurality of portions of the data;
(b) comparing the updated overall error-detecting code value to the expected error-detecting code value; and
in response to determining that the updated overall error-detecting code value does not match the expected error-detecting code value based on the comparing:
(c) identifying at least one portion of the corrected plurality of portions of the data as corresponding to an incorrect error-detecting code state;
(d) for each respective portion of the identified at least one portion:
stepping to the respective portion of the identified at least one portion; and
correcting the respective identified portion of the identified at least one portion of the data that corresponds to the incorrect error-detecting code state to generate another corrected plurality of portions of data;
(e) setting the incorrect error-detecting code state that corresponds to each of the identified at least one portion of the data to the correct error-detecting code state; and
(f) repeating (a)-(e) until the updated overall error-detecting code value matches the expected error-detecting code value.

8. The method according to claim 1, wherein correcting the identified at least one portion of the data that corresponds to the incorrect error-detecting code state to generate a corrected plurality of portions of data comprises:
requesting the identified at least one portion of the data to be retransmitted; and
receiving a retransmitted at least one portion of the data.

9. The method according to claim 1, wherein receiving a plurality of portions of the data and an expected error-detecting code value corresponding to the data comprises receiving an expected linear error-detecting code value corresponding to the data.

10. The method according to claim 9, wherein receiving the expected linear error-detecting code value corresponding to the data comprises receiving a low-density parity-check codeword corresponding to the data.

11. A system comprising:
a memory; and
processing circuitry, configured to:
receive a plurality of portions of the data and an expected error-detecting code value corresponding to the data;
calculate an overall error-detecting code value of the data;
compare the overall error-detecting code value to the expected error-detecting code value; and
in response to a determination that the overall error-detecting code value does not match the expected error-detecting code value based on the comparison:
identify at least one portion of the plurality of portions of the data as corresponding to an incorrect error-detecting code state;
for each respective portion of the identified at least one portion:
step to the respective portion of the identified at least one portion; and correct the respective identified portion of the identified at least one portion of the data that corresponds to the incorrect error-detecting code state to generate a corrected plurality of portions of data; and set the incorrect error-detecting code state that corresponds to each of the identified at least one portion of the data to a correct error-detecting code state.

12. The system of claim 11, wherein to step to the respective portion of the identified at least one portion the processing circuitry is to step, in reverse, to the respective portion of the identified at least one portion.

13. The system of claim 11, wherein to identify at least one portion of the plurality of portions of the data as corresponding to an incorrect error-detecting code state the processing circuitry is to identify at least one portion of the plurality of portions by traversing the plurality of portions of the data.

14. The system of claim 11, wherein to identify at least one portion of the plurality of portions of the data as corresponding to the incorrect error-detecting state the processing circuitry is to traverse the plurality of portions of the data in reverse by using an updating matrix.

15. The system of claim 14, wherein the data corresponds to an N-bit error-detecting code state and the updating matrix is a square matrix of size N, wherein to traverse the plurality of portions of the data in reverse the processing circuitry is to determine a rewound error-detecting code state by performing matrix multiplication of the N-bit error-detecting code state and the updating matrix.

16. The system of claim 11, wherein to calculate the overall error-detecting code value of the data the processing circuitry is to:

calculate an error-detecting code value for each respective portion of the plurality of portions of the data;

store the error-detecting code value for each respective portion of the plurality of portions of the data in the memory; and calculate the overall error-detecting code value based on each respective error-detecting code values for each respective portion of the data.

17. The system of claim 11, wherein the processing circuitry is further to:

(a) calculate an updated overall error-detecting code value of the corrected plurality of portions of the data;

(b) compare the updated overall error-detecting code value to the expected error-detecting code value; and in response to determining that the updated overall error-detecting code value does not match the expected error-detecting code value based on the comparing:

(c) identify at least one portion of the corrected plurality of portions of the data as corresponding to an incorrect error-detecting code state;

(d) for each respective portion of the identified at least one portion:

step to the respective portion of the identified at least one portion; and correct the respective identified portion of the identified at least one portion of the data that corresponds to the incorrect error-detecting code state to generate another corrected plurality of portions of data;

(e) set the incorrect error-detecting code state that corresponds to each of the identified at least one portion of the data to the correct error-detecting code state; and (f) repeat (a)-(e) until the updated overall error-detecting code value matches the expected error-detecting code value.

18. The system of claim 11, wherein to correct the identified at least one portion of the data that corresponds to the incorrect error-detecting code state to generate a corrected plurality of portions of data the processing circuitry is to:

request the identified at least one portion of the data to be retransmitted; and receive a retransmitted at least one portion of the data.

19. The system of claim 11, wherein to receive the plurality of portions of the data and the expected error-detecting code value corresponding to the data the processing circuitry is to receive an expected linear error-detecting code value corresponding to the data.

20. The system of claim 19, wherein to receive the expected linear error-detecting code value corresponding to the data the processing circuitry is to receive a low-density parity-check codeword corresponding to the data.

21. A non-transitory computer-readable medium having non-transitory computer-readable instructions encoded thereon that, when executed by processing circuitry, cause the processing circuitry to:

receive a plurality of portions of the data and an expected error-detecting code value corresponding to the data;

calculate an overall error-detecting code value of the data;

compare the overall error-detecting code value to the expected error-detecting code value; and in response to a determination that the overall error-detecting code value does not match the expected error-detecting code value based on the comparison:

identify at least one portion of the plurality of portions of the data as corresponding to an incorrect error-detecting code state;

for each respective portion of the identified at least on portion:

step to the respective portion of the identified at least one portion; and correct the respective identified portion of the identified at least one portion of the data that corresponds to the incorrect error-detecting code state to generate a corrected plurality of portions of data; and set the incorrect error-detecting code state that corresponds to each of the identified at least one portion of the data to a correct error-detecting code state.

* * * * *